(12) United States Patent
Yamamoto

(10) Patent No.: US 7,800,126 B2
(45) Date of Patent: Sep. 21, 2010

(54) III-V GROUP COMPOUND SEMICONDUCTOR LIGHT EMITTING DEVICE AND MANUFACTURING METHOD THEREOF

(75) Inventor: Kensaku Yamamoto, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/264,159

(22) Filed: Nov. 2, 2005

(65) Prior Publication Data

US 2006/0102933 A1  May 18, 2006

(30) Foreign Application Priority Data

Nov. 4, 2004  (JP) .............. 2004-320986

(51) Int. Cl.
*H01L 33/00* (2010.01)
(52) U.S. Cl. .......... 257/103; 257/13; 257/79; 257/E33.025; 257/E33.072
(58) Field of Classification Search .......... 257/79, 257/13, 103, E33.025, 72
See application file for complete search history.

(56) References Cited

U.S. PATENT DOCUMENTS

| | | | | |
|---|---|---|---|---|
| 5,790,577 | A * | 8/1998 | Kimura et al. | 372/43.01 |
| 6,194,743 | B1 * | 2/2001 | Kondoh et al. | 257/94 |
| 6,395,572 | B1 * | 5/2002 | Tsutsui et al. | 438/46 |
| 6,649,437 | B1 * | 11/2003 | Yang et al. | 438/30 |
| 6,797,987 | B2 | 9/2004 | Chen | |
| 2002/0014630 | A1 | 2/2002 | Okazaki et al. | |
| 2003/0143772 | A1 * | 7/2003 | Chen | 438/47 |
| 2004/0072383 | A1 * | 4/2004 | Nagahama et al. | 438/47 |
| 2004/0104395 | A1 | 6/2004 | Hagimoto et al. | |
| 2004/0191939 | A1 * | 9/2004 | Kon et al. | 438/22 |
| 2005/0129899 | A1 | 6/2005 | Abiko et al. | |
| 2006/0057817 | A1 * | 3/2006 | Sonoda et al. | 438/455 |
| 2006/0145159 | A1 * | 7/2006 | Yokoyama et al. | 257/72 |

FOREIGN PATENT DOCUMENTS

| | | |
|---|---|---|
| CN | 1330416 | 1/2002 |
| JP | 2001-339100 | 12/2001 |
| JP | 2002-026392 | 1/2002 |
| JP | 2003-163373 | 6/2003 |
| JP | 2004-235506 | 8/2004 |
| JP | 2004-265465 | 9/2004 |

* cited by examiner

*Primary Examiner*—Kiesha R Bryant
*Assistant Examiner*—Minchul Yang
(74) *Attorney, Agent, or Firm*—Harness, Dickey & Pierce, P.L.C.

(57) ABSTRACT

A light emitting device including a III-V group compound semiconductor includes a first stacked body and a second stacked body. The first stacked body includes a III-V group compound semiconductor stacked body, and a reflection layer, a first diffusion suppressing layer and a first metal layer formed on one main surface of the III-V group compound semiconductor stacked body. The second stacked body includes a semiconductor substrate and a second metal layer. The first stacked body and the second stacked body are joined by the first metal layer and the second metal layer, and by the first diffusion suppressing layer, diffusion of atoms between the reflection layer and the first metal layer is suppressed. Therefore, a III-V group compound semiconductor device having high efficiency of light emission to the outside per chip and manufacturing method thereof can be provided.

24 Claims, 4 Drawing Sheets

III-V GROUP COMPOUND SEMICONDUCTOR LIGHT EMITTING DEVICE AND MANUFACTURING METHOD THEREOF

This non-provisional application is based on Japanese Patent Application No. 2004-320986 filed with the Japan Patent Office on Nov. 4, 2004, the entire contents of which are hereby incorporated by reference.

BACKGROUND OF THE INVENTION

1. Field of the Invention

The present invention relates to a III-V group compound semiconductor light emitting device and to a manufacturing method thereof, and more specifically, to a III-V group compound semiconductor light emitting device allowing highly efficient extraction of light to the outside and to a manufacturing method thereof.

2. Description of the Background Art

Conventionally, a sapphire substrate is mainly used for a III-group compound semiconductor light emitting device, and nitride semiconductor light emitting devices including sapphire substrates have been commercially available. Here, as a sapphire substrate is an insulator, both p-side and n-side electrodes are arranged on a plurality of III-group nitride semiconductor layers formed on one main surface of the substrate. (See, for example, Japanese Patent Laying-Open No. 2003-163373 (hereinafter referred to as Reference 1) and Japanese Patent Laying-Open No. 2002-026392 (hereinafter referred to as Reference 2)).

Referring to FIG. 6, the III-group nitride compound semiconductor light emitting device disclosed in Reference 1 has, on a sapphire substrate 601, a buffer layer 602, a first reflection layer 606, an n-type semiconductor layer 603, a light generating layer 604, a p-type semiconductor layer 605, a second reflection layer 607 and a p-side electrode 608 stacked in this order. On a partially exposed portion of n-type semiconductor layer 603, an n-side electrode 609 is formed. In the example of FIG. 6, the second reflection layer 607 also serves as p-side electrode 608.

Specifically, in the light emitting device shown in FIG. 6, light emitted from light generating layer 604 is resonated between the first and second reflection layers 606 and 607, and thereafter emitted efficiently to the outside through sapphire substrate 601, whereby optical output of the light emitting device is improved. For this purpose, the first reflection layer 606 is adapted to have lower reflectance than the second reflection layer 607.

In the semiconductor light emitting device disclosed in Reference 2 also, an electrode of high reflectance is similarly provided on the side of p-type semiconductor layer, so that the light from the light generating layer is reflected toward the sapphire substrate, and hence efficiency of taking light to the outside is improved.

In the light emitting devices disclosed in References 1 and 2, the n-side and p-side electrodes are provided on a stacked body of semiconductor layers formed on one main surface of the substrate. The light emitting device is connected to the outside by a metal wire. Here, pad electrodes formed on the p-side electrode 608 and n-side electrode 609 of the light emitting device put obstruction in taking out the light from the light generating layer. Further, as n-type semiconductor layer 603 is exposed, it becomes necessary to form n-side electrode 609 by removing a part of light generating layer 604 of the light emitting device, resulting in a non-emitting portion in the light emitting device. As the light generating area of an active layer becomes smaller than the chip area in the direction of the plane of the substrate, there is a loss in light extraction from the light emitting device per chip area.

Further, in light emitting devices disclosed in References 1 and 2, a metal layer having high reflectance (reflection layer) is provided on a p-type GaN layer, and therefore, the light from the active layer is reflected by the reflecting layer and emitted through the substrate, dependent on the device structure. It is noted, however, that as metals are used for the reflecting layer and the layer in contact therewith, atoms in respective layers diffuse to each other. Therefore, different types of atoms undesirably enter the reflection layer from the metal layer in contact with the reflection layer, lowering the reflectance of the reflection layer.

SUMMARY OF TH INVENTION

An object of the present invention is to provide a III-V group compound semiconductor device having high efficiency of taking light to the outside per chip area, and manufacturing method thereof.

In order to attain the above described object, the present invention provides a III-V group compound semiconductor light emitting device including a MI-V group compound semiconductor, including: a first stacked body and a second stacked body, the first stacked body including a III-V group compound semiconductor stacked body of an n-type semiconductor layer, an active layer and a p-type semiconductor layer stacked in order, and a reflection layer, a first diffusion suppressing layer and a first metal layer formed on one main surface of the III-V group compound semiconductor stacked body, the second stacked body including a semiconductor substrate and a second metal layer; wherein the first and second stacked bodies are joined by the first metal layer and the second metal layer; and the first diffusion suppressing layer suppresses diffusion of atoms between the reflection layer and the first metal layer.

In the III-V group compound semiconductor light emitting device in accordance with the present invention, the first diffusion suppressing layer is in contact with both the reflection layer and the first metal layer, whereby diffusion of atoms between the reflection layer and the first metal layer is suppressed. Further, the first diffusion suppressing layer may be conductive both to the reflection layer and the first metal layer. Further, the first diffusion suppressing layer may contain a metal having slow rate of diffusion to at least one of the reflection layer and the first metal layer.

Further, in the III-V group compound semiconductor light emitting device, the second stacked body further includes an ohmic contact metal layer and a second diffusion suppressing layer; and the second diffusion suppressing layer suppresses diffusion of atoms between the ohmic contact metal layer and the second metal layer. Here, the second diffusion suppressing layer is in contact with both the ohmic contact metal layer and the second metal layer, whereby diffusion of atoms between the reflection layer and the second metal layer is suppressed. Further, the second diffusion suppressing layer may be conductive both to the ohmic contact metal layer and the second metal layer. Further, the second diffusion suppressing layer may contain a metal having slow rate of diffusion to at least one of the ohmic contact metal layer and the second metal layer.

In the diffusion suppressing layer of the III-V group compound semiconductor light emitting device in accordance with the present invention, the metal having slow rate of diffusion may be at least one metal selected from the group consisting of W, Mo, Nb, Ni and Ti. Further, the metal having slow rate of diffusion may be an Ni—Ti alloy. Further, the diffusion suppressing layer may have a thickness of at least 50 nm.

The metal layer of the III-V group compound semiconductor light emitting device in accordance with the present invention may contain at least a metal selected from the group consisting of Ag, Au, Sn, Cu, Pd, In, Ge, Bi, Zn and Pb.

Further, the reflecting layer of the III-V group compound semiconductor light emitting device in accordance with the present invention may contain a metal of high reflectance selected from the group consisting of Ag, Al, Rh, and Pd. The reflecting layer may further contain at least a metal selected from the group consisting of Au, Pt, Pd, Rh, Cu, Nd and Bi. Further, the reflection layer may contain an alloy selected from the group consisting of Ag—Nd, Ag—Au, Ag—Pt, Ag—Rh, Ag—Cu, Ag—Pd, Ag—Cu—Nd, Ag—Bi—Nd, Ag—Pd, Ag—Cu—Pd, Al—Nd, Al—Au, Al—Pt, Al—Rh, Al—Cu, Al—Pd, Al—Cu—Nd, Al—Bi—Nd, Al—Pd and Al—Cu—Pd.

Further, the III-V group compound semiconductor light emitting device in accordance with the present invention may have resistivity of at least $1.0 \times 10^{-6}$ Ω·cm to at most 10 Ω·cm. Further, thermal conductivity of the semiconductor substrate may be set equal to or higher than the highest thermal conductivity of the III-group compound semiconductor forming the III-V group compound semiconductor stacked body. Further, the semiconductor substrate may be a substrate selected from the group consisting of an Si substrate, a GaAs substrate, a ZnO substrate, a Cu substrate, a W substrate, a CuW substrate, an Mo substrate, an InP substrate, a GaN substrate, an SiC substrate, and a GaP substrate.

The present invention provides a method of manufacturing a III-V group compound semiconductor light emitting device, for manufacturing a light emitting device containing a III-V group compound semiconductor, including the steps of: forming, on an underlying substrate, a first stacked body including a III-V group compound semiconductor stacked body, a reflection layer and a first metal layer; forming a second stacked body including a semiconductor substrate and a second metal layer; joining the first stacked body and the second stacked body by the first metal layer and the second metal layer; and removing the underlying substrate from the first stacked body.

In the method of manufacturing the III-V group compound semiconductor light emitting device in accordance with the present invention, the first metal layer and the second metal layer may be joined by heat and pressure, in vacuum or in an inert gas atmosphere. Further, difference in linear expansion coefficient between the semiconductor substrate and the underlying substrate may be at most $1.0 \times 10^{-5}$ K$^{-1}$. Further, the underlying substrate may be removed from the fist stacked body by laser irradiation from the side of the underlying substrate. Here, the laser energy may be not higher than forbidden band width of the underlying substrate and not lower than forbidden band width of the layer to be removed. In the first stacked body, a first diffusion suppressing layer may be formed between the reflection layer and the first metal layer, so as to suppress diffusion of atoms between the reflection layer and the metal layer by the first diffusion suppressing layer. Further, in the second stacked body, a second diffusion suppressing layer may be formed between an ohmic contact metal layer and the second metal layer in the second stacked body, so as to suppress diffusion of atoms between the ohmic contact metal layer and the second metal layer.

As described above, by the present invention, a III-V group compound semiconductor device having high efficiency of taking light to the outside per chip area and manufacturing method thereof can be provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
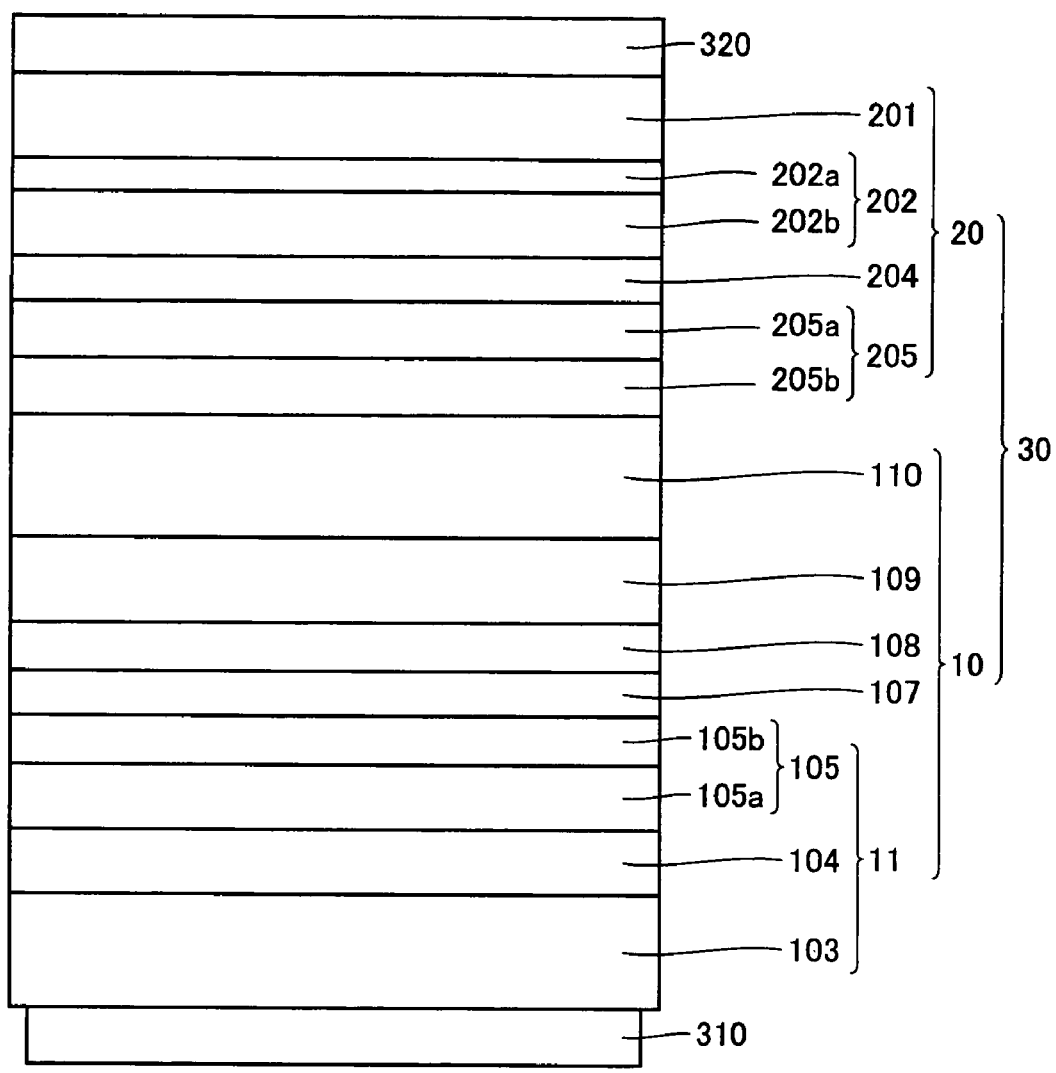
FIG. 1 is a schematic cross sectional view showing a III-V group compound semiconductor light emitting device in accordance with the present invention.

Referring to FIG. 1, the III-V group compound semiconductor light emitting device in accordance with the present invention is a light emitting device including a III-V group compound semiconductor, and it includes a first stacked body 10 and a second stacked body 20. The first stacked body 10 includes: a III-V group compound semiconductor stacked body 11 including an n-type semiconductor layer 103, an active layer 104, and a p-type semiconductor layer 105 stacked in this order; an ohmic contact metal layer 107, a reflection layer 108 for reflecting light radiated from active layer 104, a first diffusion suppressing layer 109, and a first metal layer 110, formed on one main surface of the III-V group compound semiconductor stacked body 11. The second stacked body 20 includes: a conductive substrate 201; an ohmic contact metal layer 202; a second diffusion suppressing layer 204; and a second metal layer 205. The first and second stacked bodies 10 and 20 are joined to each other by the first and second metal layers 110 and 205. The first diffusion suppressing layer 109 is positioned between reflection layer 108 and the first metal layer 110, and the second diffusion suppressing layer 204 is positioned between ohmic contact metal layer 202 and the second metal layer 205, whereby diffusion of atoms between reflection layer 108 and the first metal layer 110 and diffusion of atoms between ohmic contact metal layer 202 and the second metal layer 205 can be suppressed. Here, diffusion of atoms between two layers refers to inter-diffusion in which atoms of one layer diffuse to the other layer and atoms of the other layer diffuse to the one layer, and unidirectional diffusion in which only the atoms of one layer diffuse to the other layer.

In this manner, the device includes III-V group compound semiconductor stacked body 11 having n-type semiconductor layer 103, active layer 104 to be the light generating layer and p-type semiconductor layer 105 stacked, and the first stacked body including reflection layer 108, first diffusion suppressing layer 109 and first metal layer 110 formed on one main surface of the III-V group compound semiconductor stacked body 11 and the second stacked body 20 including semiconductor substrate 201 and the second metal layer 205 are joined by the first and second metal layers 10 and 20. Therefore, it becomes possible to form electrodes on both main surfaces of the stacked body 30 formed of the first and second stacked bodies 10 and 20, and therefore, manufacturing of a light emitting device having high efficiency of light emission to the outside per chip becomes possible. In addition, as the diffusion suppressing layer is positioned between the reflection layer and the first metal layer, diffusion of atoms between reflection layer 108 and the first metal layer 110 can be suppressed by diffusion suppressing layer 109, and high reflectance of the reflection layer can be maintained. Thus, efficiency of light emission to the outside can further be improved.

A III-V group compound semiconductor light emitting device in accordance with the present invention is manufactured, by way of example, in the following manner.

Figure 2:
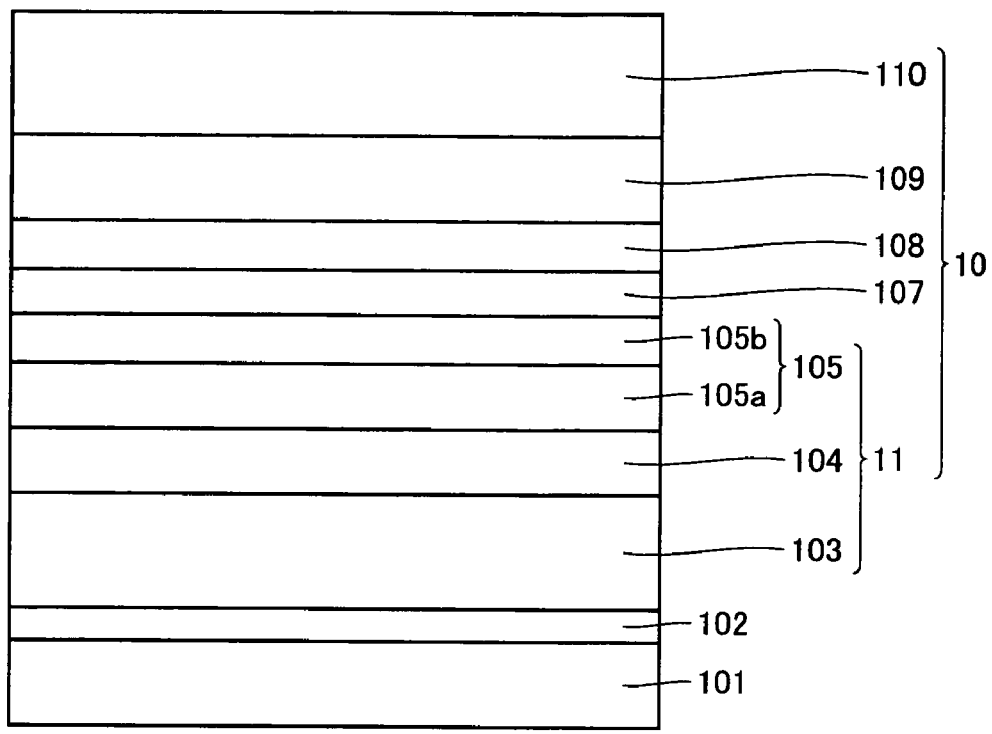
FIG. 2 is a schematic cross sectional view showing the first stacked body in a step of manufacturing a III-V group compound semiconductor light emitting device in accordance with the present invention.

In manufacturing the III-V group compound semiconductor, first, the first stacked body 10 as shown in FIG. 2 is manufactured. The first stacked body 10 includes, on a sapphire substrate as an underlying substrate and a GaN buffer layer 102 formed thereon, stacked in this order: an n-type GaN layer as the n-type semiconductor layer 103; the active layer 104 having an MQW (Multi Quantum Well) structure consisting of four pairs of $In_{0.08}Ga_{0.92}N$ layer and GaN layer combined alternately as the light generating layer; a p-type $Al_xGa_{1-x}N$ layer ($0<x\leq1$) 105a and a p-type GaN layer 105b as the p-type semiconductor layer 105; the light transmitting ohmic contact metal layer 107; the reflection layer 108 reflecting the light from active layer 104; and the first metal layer 110 for the joint with the second stacked body, which will be described later.

More specifically, referring to FIG. 2, the first stacked body 10 is manufactured by stacking a plurality of III-group nitride semiconductor layers by MOCVD (Metal Organic Chemical Vapor Deposition), on a sapphire substrate as the underlying substrate 101. First, the sapphire substrate is mounted on a susceptor in a reaction chamber, and baked at 1200° C. in an $H_2$ atmosphere. Thereafter, the substrate temperature is lowered to 450° C., and a GaN buffer layer as semiconductor buffer layer 102 is formed to the thickness of 30 nm, by using trimethyl gallium (hereinafter denoted by TMG) and ammonia (hereinafter $NH_3$) as the row material and a mixed gas of $N_2$ and $H_2$ as a carrier gas. Thereafter, by rapidly increasing the substrate temperature to 1080° C., an n-type GaN layer as the n-type semiconductor layer 103 is formed to the thickness of 10 μm, on semiconductor buffer layer 102, using TMG, $NH_3$ and monosilane (hereinafter $SiH_4$) as a dopant.

Thereafter, the substrate temperature is lowered to 750° C., and on the n-type semiconductor layer 103, the active layer 104 having the MQW structure consisting of four pairs of $In_{0.08}Ga_{0.92}N$ well layer of 3 nm in thickness and GaN barrier layer of 9 nm in thickness stacked alternately is formed, using trimethyl indium (hereinafter referred to as TMI), TMG and $NH_3$.

Thereafter, the substrate temperature is increased to 1100° C., and on the active layer 104 described above, an Mg-doped p-type $Al_{0.08}Ga_{0.92}N$ layer 105a of 30 nm in thickness and an Mg-doped p-type GaN layer 105b of 120 nm in thickness are formed as the p-type semiconductor layer 105. Here, the p-type $Al_{0.08}Ga_{0.92}N$ layer 105a is grown using trimethyl aluminum (hereinafter TMA), TMG, $NH_3$ and cyclopentadienyl magnesium (hereinafter $Cp_2Mg$) as a dopant, and the p-type GaN layer 105b is grown using TMG, $NH_3$ and $Cp_2Mg$.

Then, the substrate temperature is lowered to the room temperature (25° C.), and the stacked body is taken out to the atmosphere. Then, in order to activate the p-type conductivity of Mg-doped p-type semiconductor layer 105, heat treatment is performed at 800° C. for 5 minutes in an $N_2$ atmosphere, using a heat treatment furnace.

Thereafter, the heat-treated stacked body is subjected to organic cleaning, and on the p-type GaN layer 105b, a Pd (palladium) layer of 1 nm to 20 nm thickness is formed as the light transmitting ohmic contact metal layer 107, by vacuum deposition at the substrate temperature of 100° C. As the ohmic contact to the p-type GaN layer 105b is established by the Pd layer, the current can spread in the lateral direction by the reflection layer 108 formed thereon, and therefore, the Pd layer can be made thinner. Preferable thickness is 1 nm to 7 nm. The stacked body formed up to the Pd layer is annealed in vacuum, at 500° C. for 5 minutes.

On the Pd layer as the ohmic contact metal layer 107, an Ag—Nd layer is formed to the thickness of 150 nm as the reflection layer 108. Here, the reflection layer should be thick enough not to transmit the light from active layer, and the thickness of 30 nm or more is sufficient.

Thereafter, the first diffusion suppressing layer 109 containing an Ni—Ti alloy having Ni of 50 mass % or more as a main component is formed to the thickness of 0.5 μm by sputtering, for suppressing diffusion of atoms between reflection layer 108 and the first metal layer 110, which will be described later.

Further, on the first diffusion suppressing layer 109, the first metal layer 110 containing Au, of 3.5 μm in thickness is formed. The first metal layer 110 may be formed by any of or two or more of vacuum deposition, sputtering and plating. Thus, the first stacked body 10 is obtained.

Figure 3:
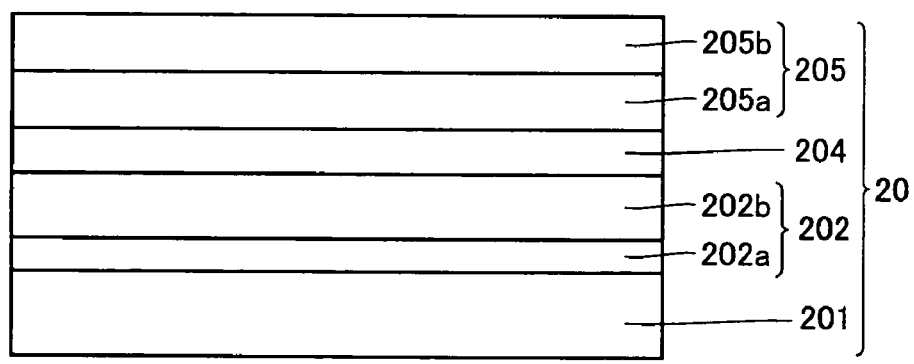
FIG. 3 is a schematic cross sectional view showing the second stacked body in a step of manufacturing a III-V group compound semiconductor light emitting device in accordance with the present invention.

Next, the second stacked body 20 such as shown in FIG. 3 is manufactured. The second stacked body 20 includes an n-type Si substrate as a conductive semiconductor substrate 201, and successively stacked on a (100) plane of the n-type Si substrate, a Ti layer 202a and an Al layer 202b as the ohmic contact metal layer 202, the second diffusion suppressing layer 204, and an Au layer 205a and an Au—Sn (Au: 80 mass %) layer 205b as the second metal layer 205.

More specifically, referring to FIG. 3, the second stacked body 20 is formed in the following manner. An Si substrate as the conductive semiconductor substrate 201 is subjected to organic cleaning, and then etched with an HF solution of 5 mass %. Thereafter, the substrate temperature is set to 100° C., a Ti layer 202a of 15 nm to 100 nm in thickness that can be in ohmic contact with the n-type Si substrate as conductive semiconductor substrate 201, an Al layer 202b of 300 nm in thickness, and a second diffusion suppressing layer 204 having the thickness of 0.5 μm and containing Ni—Ti alloy for suppressing diffusion of atoms between the Al layer and the second metal layer 205, which will be described later, are formed successively by vacuum deposition.

Thereafter, on the second diffusion suppressing layer 204, an Au film 205a having the thickness of 1 μm and an Au—Sn (Au: 80 mass %) layer 205b having the thickness of 4.5 μm are successively formed as the second metal layer 205, so as to facilitate joint to the first stacked body 10 shown in FIG. 2. Thus, the second stacked body 20 shown in FIG. 3 is obtained.

Figure 4:
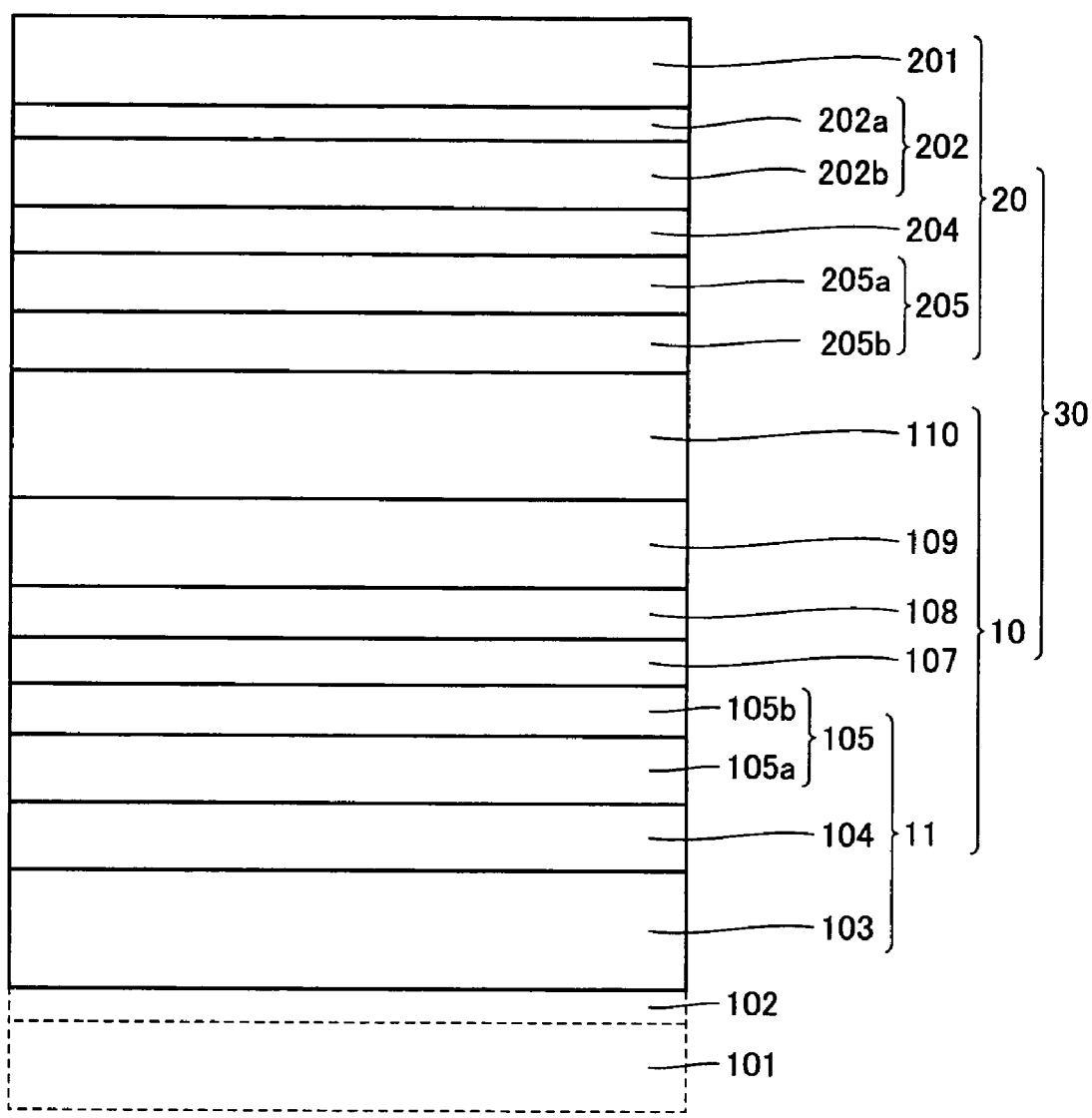
FIG. 4 is a schematic cross sectional view showing the stacked body in a step of manufacturing a III-V group compound semiconductor light emitting device in accordance with the present invention.

Thereafter, as shown in FIG. 4, the first stacked body 10 and the second stacked body 20 are adhered, such that the first metal layer 10 of the first stacked body is joined to the second metal layer 205 of the second stacked body. The condition for the joint is not specifically limited. Preferably, the pressure is about 2.0 MPa (200N/cm$^2$), the temperature is about 280° C., and the holding time is about 10 minutes. Here, the pressure and holding time of joint refer to the pressure and holding time after the substrate is heated to the temperature for adhesion. Specifically, until the substrate temperature reaches the desired temperature for adhesion, the pressure on the substrates that are put together may not be 2.0 MPa (200N/cm$^2$).

Further, adhesion of the first stacked body 10 and the second stacked body 20 described above is performed in vacuum, in order to suppress generation of voids at the joint portion between the first and second metal layers 10 and 205. Though the adhesion is naturally possible in the atmosphere, preferably, it is performed in vacuum, particularly in high degree of vacuum of 10 Pa (1.0×10$^{-1}$ mbar) or higher, so as to further suppress voids in the metal layer. Alternatively, it may be performed not in vacuum but in an inert gas atmosphere of Ar, N$_2$ or the like, at a temperature of about 273° C. to about 320° C., that is, not lower than the eutectic temperature of Au—Sn (Au: 80 mass %) alloy to about 40° C. higher temperature, under the pressure of 1.0 MPa to 10 MPa (100N/cm$^2$ to 1000N/cm$^2$) and preferably under the pressure of 1.5 MPa to 5.0 MPa (150N/cm$^2$ to 500N/cm$^2$). Further, the time necessary for adhesion is preferably at most 30 minutes after it reaches the adhesion temperature. Diffusion to the metals is better suppressed if the adhesion temperature is closer to the eutectic temperature and the adhesion time is shorter. As for the adhesion pressure, the range described above is preferred in order to prevent any damage to the substrate.

Thereafter, in order to remove the sapphire substrate as the underlying substrate 101 on which the III-group nitride semiconductor layers have been grown, laser having an energy that is not higher than the forbidden band width of underlying layer 101 and not lower than the forbidden band width of buffer layer 102 as the layer to be removed, that is, solid state laser converted to have a wavelength not absorbed by the underlying substrate 101 but absorbed by buffer layer 102, is directed to enter sapphire substrate 101 as the underlying layer 101. Consequently, the laser beam that has passed through the underlying substrate 101 melts the GaN buffer layer as the buffer layer 102 and part of n-type GaN layer as the n-type semiconductor layer 103 on the side of buffer layer 102. As such a laser beam, a pulse laser beam having the energy density of 10 µJ/cm$^2$ to 100 mJ/cm$^2$ may be used. By the pulse laser entering from the side of sapphire substrate as the underlying substrate 101, the sapphire substrate as the underlying substrate 101, the GaN buffer layer as buffer layer 102 and part of the n-type GaN layer as n-type semiconductor layer 103 are removed. On the exposed surface of n-type GaN layer, traces and defects caused by laser irradiation remain. Therefore, the n-type Si substrate, which is the semiconductor substrate 201 of stacked body 30 including first and second stacked bodies 10 and 20, is attached to a sample table (not shown) of a grinder or polisher using an electron wax, and the n-type GaN layer of stacked body 30 is ground and/or polished to about 1 µm to about 2 µm from the surface. The thickness of removal should preferably be selected such that the n-type GaN layer as the n-type semiconductor layer 103 is left and the damage by the grinding and/or polishing is not caused in the active layer 104. Thereafter, the stacked body 30 is removed from the sample table, and remaining electron wax is cleaned using an organic solvent.

Again referring to FIG. 1, on n-type semiconductor layer 103 of the cleaned stacked body 30, an indium tin oxide (hereinafter ITO) layer is deposited to the thickness of 100 nm by sputtering. A photo-resist (not shown) is applied to the ITO layer, and by photolithography and etching using FeCl$_3$, part of the ITO layer is removed to form a light transmitting electrode to be the first electrode 310. Further, on semiconductor substrate 201 of stacked body 30, a layer formed of Au and Au—Sb alloy having the thickness of 150 nm is formed by vapor deposition, as the second electrode 320. Thereafter, using a scribing machine or a dicing machine, the stacked body 30 is divided into chips each having the size of 200 µm×200 µm. The III-V group compound semiconductor light emitting device shown in FIG. 1 manufactured in this manner has the emission wavelength of 470 mm.

Figure 6:
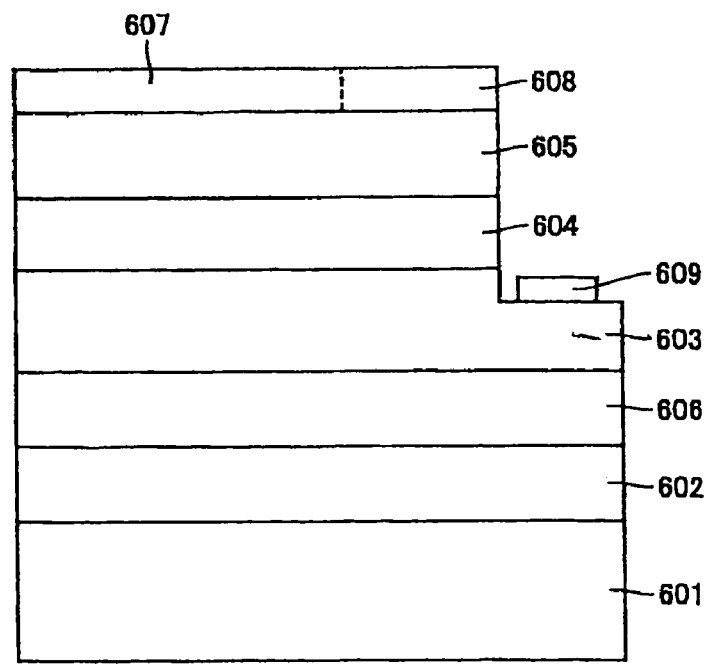
FIG. 6 is a schematic cross sectional view showing a conventional III-V group compound semiconductor light emitting device.

The area of light emission of the light emitting device manufactured in this manner is the same as the area of the main surface of second electrode 320. By contrast, in the conventional light emitting device shown in FIG. 6, it is necessary to form a portion not emitting light on the light emitting device, to form the n-side electrode 609. Therefore, when the light emitting devices are formed to have the same chip area, the light emitting area of the device in accordance with the present invention becomes larger than that of the conventional light emitting device, and therefore, the device of the present invention comes to have higher efficiency of light emission to the outside. Therefore, higher output can be attained.

Figure 5:
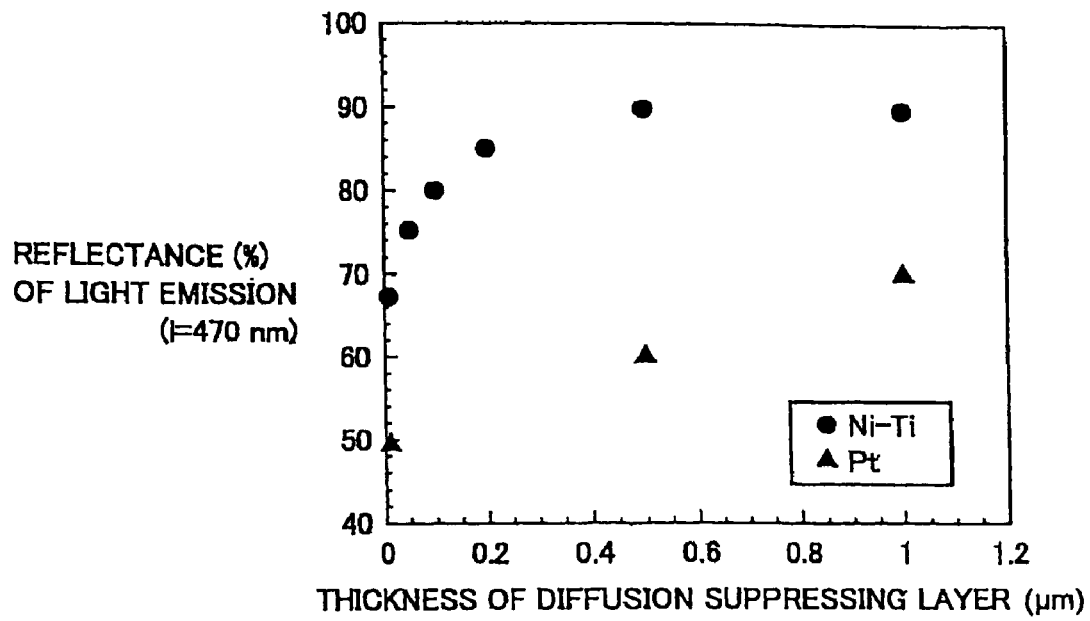
FIG. 5 represents relation of difference in light reflectance to the type and thickness of diffusion suppressing layer, in the III-V group compound light emitting device.

Referring to FIG. 5 showing the difference in emission reflection with respect to the type and thickness of diffusion suppressing layer of III-V group compound semiconductor light emitting device, the effect of diffusion suppressing layer 109 will be described. A light emitting device having the same structure as the above-described embodiment except that the first diffusion suppressing layer 109 is of different type and different thickness was formed. The conditions for adhesion of the first and second stacked bodies were also the same (adhesion pressure: 2 MPa, adhesion temperature: 280° C., holding time of adhesion: 10 min).

As the first diffusion suppressing layer 109 of the stacked body 30 of III-group nitride semiconductor device, a layer formed of an Ni—Ti alloy, which is a metal having slow rate of diffusion to the Ag—Nd layer as the first reflection layer 108 and to the Au layer as the first metal layer 110, and a layer formed of Pt having high rate of diffusion to these layers were used, and reflectance of light with emission wavelength of 470 nm were compared. Referring to FIG. 5, when the first diffusion suppressing layer 109 was formed of Ni—Ti layer having the thickness of 0.5 µm and 1.0 µm, reflectance was as high as 90%. On the contrary, when the first diffusion suppressing layer 109 was formed of Pt layer, the reflectance was as low as 60% with the thickness of 0.5 µm, and 70% with the thickness of 1.0 µm. In the present embodiment, when the first diffusion suppressing layer 109 was formed of the Ni—Ti layer, the color of reflection layer 108 observed from the side of n-type GaN layer 103 was silver, which is the color of Ag—Nd layer as the reflection layer 108. When the first diffusion suppressing layer 109 was formed of the Pt layer, gold spots were observed on the silver Ag—Ng layer as the first reflection layer 108, which spots were considered to be caused by diffusion of Au atoms from the Au layer as the first junction metal layer 110. From the foregoing, it can be understood that the Pt layer does not serve as the diffusion suppressing layer, while the Ni—Ti layer is effective as the diffusion suppressing layer.

Further, the Ni—Ti layer as the first diffusion suppressing layer 109 was made thinner. When the thickness was 0.01 µm (10 nm), reflectance was 67%, when it was 0.05 µm (50 nm), reflectance was 75%, when it was 0.1 µm, reflectance was 80% and when it was 0.2 µm, reflectance was 85%. From these results, it can be understood that the Ni—Ti layer exhibits the function of diffusion suppressing layer when it has the thickness of 10 nm or thicker. Preferable thickness of diffusion suppressing layer is at least 50 nm. Further, light emitting devices were formed with the adhesion temperature of 273 to 320° C., adhesion pressure of 1.0 MPa to 10 MPa (100N/cm$^2$ to 1000N/cm$^2$) and adhesion time of 1 second to 30 minutes, similar tests were conducted, and similar results were obtained.

Specifically, in the present embodiment, the first diffusion suppressing layer 109 was considered and an Ni—Ti layer having the thickness of 0.5 μm, which is optimal as the first diffusion suppressing layer 109, was used so that the reflection layer 108 could maintain the high reflectance, and efficiency of light emission to the outside can be improved than the conventional art.

Further, in the present embodiment, as the reflection layer 108, an Ag—Nd layer having high reflectance in the range of 360 to 600 nm was used. In place of the layer containing Ag, a layer having at least one metal of Al, Rh and Pd may be used, dependent on the emission wavelength of the light emitting device. Further, a layer containing at least two types of alloys selected from the group consisting of Ag, Bi, Pd, Au, Nd, Cu, Pt, Rh and Ni may be used, and particularly, an Ag—Pd layer, an Ag—Bi layer, an Ag—Nd layer and an Ag—Nd—Cu layer may preferably be used.

The reason for this is as follows. Assume that a metal having high reflectance is used by itself as the reflection layer. It is noted that Al is susceptible to surface oxidation, and Ag is susceptible to migration. Therefore, when the light emitting device having such a metal by itself as the reflection layer is used for a long time, high reflectance of the reflection layer cannot be maintained because of oxidation or migration mentioned above, and emission characteristics would vary from the initial values. Therefore, rather than using a metal of high reflectance by itself, it is preferred to use an alloy containing a noble metal such as Au, Pt, Pd, Rh, Cu or Bi, or metal of rare earth element such as Nd, that are said to suppress oxidation or migration, or metal having oxidation resistance and/or chlorine resistance added to the metal of high reflectance. Here, the ratio of metal for suppressing oxidation or migration should be as low as not to degrade high reflectance characteristic of the metal having high reflectance, and preferably, it is at most about 5 mass % of the alloy.

In the present embodiment, an Au layer and an Au—Sn layer (Au: 80 mass %) are used as the metal layers 10 and 205 for joining the first and second stacked bodies 10 and 20. It is noted, however, that the composition of Au—Sn alloy may be changed, and an Au—Sn alloy (Au: 70 mass %) may be used. Further, as the metal layers 110 and 205, an Au layer and an Sn layer, an Ag—Cu—Sn layer and an Ag—Cu—Sn layer, or an Au layer and an Au—Si layer may be used. When an Ag—Cu—Sn layer is used as the second metal layer, the adhesion temperature should be set to 260° C. to 320° C., and when an Au layer and an Au—Si layer are used, the adhesion temperature should be set to 270° C. to 380° C., and in both cases, the adhesion pressure should be set to 1.0 MPa to 10.0 MPa (100N/cm$^2$ to 1000N/cm$^2$). This is because the adhesion condition much depends on the melting point, eutectic temperature and reactivity between the metals. Particularly in the case of adhering an Si layer and an Au—Si layer, reactivity therebetween is so high as to cause reaction even at a temperature lower than the eutectic point.

Further, the metal layers 110 and 205 may contain at least one metal of Sn, Pd, In, Ge, Bi, Zn and Pb other than Ag, Au and Au—Sn described above, and a material having low eutectic point such as the one used as solder material may be selected.

In the present embodiment, as the semiconductor substrate for forming the conductive second stacked body 20, an n-type Si substrate (coefficient of linear expansion: 5.3×10$^{-6}$ K$^{-1}$, thermal conductivity: 1.4 W·cm$^{-1}$·K$^{-1}$, resistivity:0.01 Ω·cm) is used. It is noted, however, that the following substrates may be used instead: a p-type Si substrate (coefficient of linear expansion: 2.4×10$^{-6}$ K$^{-1}$, thermal conductivity: 1.4 W·cm$^{-1}$·K$^{-1}$, resistivity:0.02 Ω·cm) doped to have conductivity; a GaAs (gallium arsenide) substrate doped to have conductivity (in the case of a p-type substrate doped with Zn, coefficient of linear expansion: 6.0×10$^{-6}$ K$^{-1}$, thermal conductivity: 0.54 W·cm$^{-1}$·K$^{-1}$, resistivity:0.03 Ω·cm or lower, in the case of Si-doped n-type substrate, coefficient of linear expansion: 6.0×10$^{-6}$ K$^{-1}$, thermal conductivity: 0.54 W·cm$^{-1}$·K$^{-1}$, resistivity:0.003 Ω·cm or lower); a ZnO (zinc oxide) substrate (coefficient of linear expansion: 3.18×10$^{-6}$ K$^{-1}$, thermal conductivity: 0.59 W·cm$^{-1}$·K$^{-1}$, resistivity: lower than 1×10$^{-4}$ Ω·cm); a Cu (copper) substrate (coefficient of linear expansion: 16.8×10$^{-6}$ K$^{-1}$, thermal conductivity: 390 W·cm$^{-1}$·K$^{-1}$, resistivity: 1.0×10$^{-6}$ Ω·cm); W (tungsten) substrate (coefficient of linear expansion: 4.3×10$^{-6}$ K$^{-1}$, thermal conductivity: 200 W·cm$^{-1}$·K$^{-1}$, resistivity: 5.5×10$^{-6}$ Ω·cm); CuW (tungsten-copper) substrate (coefficient of linear expansion: 4.3 to 10.2×10$^{-6}$ K$^{-1}$, thermal conductivity: 6.4 to 10.2 W·cm$^{-1}$·K$^{-1}$, resistivity: 1.0×10$^{-6}$ Ω·cm, dependent on composition ratio); a substrate containing two or more metal compounds of which main component is W of 90 mass % or more (for example, 97W-2Ni-1Cu or 97W-2Ni-1Fe: coefficient of linear expansion: 5.0×10$^{-6}$ K$^{-1}$, thermal conductivity: 0.9 to 1.25 W·cm$^{-1}$·K$^{-1}$, resistivity: 1.0×10$^{-6}$ Ω·cm); an Mo (molybdenum) substrate (coefficient of linear expansion: 5.1×10$^{-6}$ K$^{-1}$, thermal conductivity: 1.42 W·cm$^{-1}$·K$^{-1}$, resistivity: 1.0×10$^{-6}$ Ω·cm); an InP (indium phosphide) substrate doped to have conductivity (coefficient of linear expansion: 4.5×10$^{-6}$ K$^{-1}$, thermal conductivity: 0.7 W·cm$^{-1}$·K$^{-1}$, resistivity: 1.0×10$^{-2}$ Ω·cm or lower); a GaN (gallium nitride) substrate (coefficient of linear expansion: 5.59×10$^{-6}$ K$^{-1}$, thermal conductivity: 1.3 W·cm$^{-1}$·K$^{-1}$, resistivity: 7×10$^{-3}$ Ω·cm); an SiC (6H) (silicon carbide) substrate doped to have conductivity (coefficient of linear expansion: 4.2×10$^{-6}$ K$^{-1}$, thermal conductivity: 4.9 W·cm$^{-1}$·K$^{-1}$, resistivity: 1×10$^{-2}$ Ω·cm or lower); a GaP (gallium phosphide) substrate (coefficient of linear expansion: 5.3 to 5.81×10$^{-6}$ K$^{-1}$, thermal conductivity: 1.1 W·cm$^{-1}$·K$^{-1}$, resistivity: 0.03 Ω·cm or lower); a Ge (germanium) substrate doped to have conductivity (coefficient of linear expansion: 7.7×10$^{-6}$ K$^{-1}$, thermal conductivity: 59.9 W·cm$^{-1}$·K$^{-1}$, resistivity: 0.05 Ω·cm or lower); a carbon steel substrate (in the case of S45C, coefficient of linear expansion: 10.7×10$^{-6}$ K$^{-1}$, thermal conductivity: 0.44 W·cm$^{-1}$·K$^{-1}$, resistivity: 2.3×10$^{-6}$ Ω·cm); a metal substrate of Ti—Ni (coefficient of linear expansion: 10×10$^{-6}$ K$^{-1}$, thermal conductivity: 0.21 W·cm$^{-1}$·K$^{-1}$, resistivity: 7.0×10$^{-6}$ Ω·cm); or a ceramic substrate having low resistivity, containing ZrO$_2$ and C (in the case of a ZrO$_2$—WC substrate, coefficient of linear expansion:8.1×10$^{-6}$ K$^{-1}$, thermal conductivity: 0.15 W·cm$^{-1}$·K$^{-1}$, resistivity: 1.7×10$^{-4}$ Ω·cm).

As the semiconductor substrate 201, the substrates described above are preferably selected from the following reasons. First, as semiconductor substrate 201, a substrate having coefficient of linear expansion not much different from that of underlying substrate 101 is preferred. As the first and second stacked bodies are joined by thermal processing, if the coefficient of linear expansion between the underlying substrate on which the first stacked body is formed is much different from that of the semiconductor included in the second stacked body, after the stacked bodies are joined at a prescribed adhesion temperature and cooled to the room temperature (of 25° C., for example), the joined body would warp because of the difference in coefficient of linear expansion, or worse, separated because of the warp. From this point, the difference in coefficient of linear expansion between the semiconductor substrate and the underlying substrate should preferably be at most $1.0 \times 10^{-5}$ K$^{-1}$. In the present embodiment, a sapphire substrate having the coefficient of linear expansion of $7.4 \times 10^{-6}$ K$^{-1}$ is used as the underlying substrate and an n-type Si substrate having the coefficient of linear expansion of $5.3 \times 10^{-6}$ K$^{-1}$ is used as the semiconductor substrate 201. Therefore, the difference in the coefficient of linear expansion is as small as $2.1 \times 10^{-6}$ K$^{-1}$, and after the first and second stacked bodies 10 and 20 were adhered in accordance with the present invention, any warp or separation was not observed in the stacked body 30.

Further, it is desirable that the semiconductor substrate 201 has high thermal conductivity. By using a substrate having high thermal conductivity, the heat that generates when current is introduced to the light emitting device to cause light emission can be released to the outside with high efficiency. Highly efficient heat radiation prevents degradation of emission quantum efficiency of the light emitting device, when a large current is introduced to the light emitting device. From this point, the thermal conductivity of semiconductor substrate 201 should preferably be at least 0.5 W·cm$^{-1}$·K$^{-1}$. In the present embodiment, the thermal conductivity of n-type Si substrate used as semiconductor substrate 201 is 1.4 W·cm$^{-1}$·K$^{-1}$, which is higher than 0.5 W·cm$^{-1}$·K$^{-1}$. Therefore, heat can efficiently be radiated when the light emitting device emits light.

Further, it is preferable that the semiconductor substrate 201 has the resistivity of at least $1.0 \times 10^{-6}$ Ω·cm and at most 10 Ω·cm. By setting the resistivity of semiconductor substrate 201 within this range, voltage drop experienced in the semiconductor substrate can effectively be suppressed. Here, in the present embodiment, an n-type Si substrate having dopant (for example, Sb) concentration of $1 \times 10^{17}$ cm$^{-3}$ and resistivity of 0.01 Ω·cm is used as the semiconductor substrate 201. Further, each III-V group compound semiconductor layer of the III-V group compound semiconductor stacked body has its resistivity adjusted by doping to at least 10 Ω·cm and the metal layers and ohmic contact metal layers have their resistivity adjusted to at most $1.0 \times 10^{-6}$ Ω·cm. As the semiconductor substrate 201 of which resistivity is between that of the III-V group compound semiconductor stacked body and that of the metal layers and ohmic contact metal layers is used, voltage drop generated in the semiconductor substrate can be suppressed.

As described above, it is preferred to select the semiconductor substrate 201 taking into consideration the three characteristics described above, that is, coefficient of linear expansion, thermal conductivity and resistivity. It is preferable that the semiconductor substrate 201 satisfies all three characteristics, and at least one of the three characteristics must be satisfied.

Further, in the present embodiment, a Pd layer containing Pd is used as the ohmic contact metal layer 107. Similar effects can be attained by using a layer containing one or more metals selected from the group consisting of Ni, In, Ag and Pt, in place of Pd. Further, in place of an insulating sapphire substrate, a spinel substrate or an SiC substrate may be used.

Further, in place of Ti layer 202a as the ohmic contact meal layer 202 in contact with semiconductor substrate 201 of the present embodiment, an Au layer, or an Au—Sb layer may be used. Further, when a p-type Si substrate is used in place of the n-type Si substrate as the semiconductor substrate 201, an Al layer or a metal layer including a plurality of Al and Ti layers may be used as ohmic contact metal layer 202. Further, a conductive Ag paste may be used as the ohmic contact metal layer, provided that the n-type Si substrate has the impurity concentration of at least $1.0 \times 10^{18}$ cm$^{-3}$.

Further, the active layer 104 may be formed of a single or multiple quantum well layers, and it may be non-doped or doped with Si, As, P or the like. The well layer and the barrier layer of MQW active layer may be formed only by In$_x$Ga$_{1-x}$N layer ($0 \leq x < 1$) or formed by In$_x$Ga$_{1-x}$N layer ($0 \leq x < 1$) and a GaN layer. Further, the order of forming p-side and n-side electrodes may be determined arbitrarily, and which one may be formed first. Further, by controlling composition ratio of Al$_x$Ga$_y$In$_{1-x-y}$N ($0 \leq x$, $0 \leq y$, $x+y \leq 1$) in MQW active layer 104 having four pairs of In$_{0.08}$Ga$_{0.92}$N layer and GaN layer, a light emitting device having emission wavelength in the range of 199 nm to 652 nm can be manufactured.

Further, a method of dividing the chip is not limited to scribing or dicing, and, by way of example, laser beams may be collected and directed to a scribe line for division. The chip size is not limited to 200 μm×200 μm, and it may be 100 μm×100 μm or 1 mm×1 mm.

In the present embodiment, grinding and/or polishing of n-type semiconductor layer 103 is performed after laser irradiation, because defects are caused by laser irradiation on the n-type GaN layer and any undesirable influence of remaining parts of buffer layer 102 left on the n-type semiconductor layer 103 must be prevented. When an AlN buffer layer is used in place of the GaN buffer layer as buffer layer 102, when an Al$_x$Ga$_y$In$_{1-x-y}$N ($0 \leq x$, $0 \leq y$, $x+y \leq 1$) is formed in place of the n-type GaN layer as the n-type semiconductor layer 103 or when an arbitrary additional layer is stacked, any unnecessary layer can be removed by grinding and/or polishing. Further, as to the polishing of n-type GaN layer, RIE (Reactive Ion Etching) may be used for removal.

As described above, in the present embodiment, referring to FIG. 1, the first and second stacked bodies 10 and 20 are joined by the first metal layer 110 of the first stacked body and the second metal layer 205 of the second stacked body, and therefore, electrodes (a light transmitting electrode as the first electrode 310 and the second electrode 320) can be formed on both main surfaces of the stacked body 30. Consequently, a light emitting device from which light can be taken out with high efficiency can be obtained. Further, as the light having the wavelength of 360 to 600 nm from the light generating layer 104 is reflected to the direction of active layer 104 by using reflection layer 108, absorption of light by the n-type Si substrate as the semiconductor substrate 201 can be prevented. Further, as the light transmitting first electrode 310 using ITO of high transmittance is used, a light emitting device from which light can be taken out with high efficiency can be obtained.

In the present embodiment, the first diffusion suppressing layer 109 is in contact with both the reflection layer 108 and the first metal layer 110, so that diffusion of atoms between the reflection layer and the metal layer can be suppressed. Further, as the second diffusion suppressing layer 204 is in contact with both the ohmic contact metal layer 202 and the second metal layer 205, diffusion of atoms between the ohmic contact metal layer 202 and the second metal layer 205 can be suppressed. What is necessary to prevent such diffusion of atoms is that the first diffusion suppressing layer is positioned between the reflection layer and the metal layer for joint, and that the second diffusion suppressing layer 204 is positioned between the ohmic contact metal layer 202 and the second metal layer 205, and other layer may be positioned between the diffusion suppressing layer and the reflection layer, or between the diffusion suppressing layer and the metal layer or ohmic contact metal layer.

Further, diffusion suppressing layers 109 and 204 are not specifically limited, provided that the first diffusion suppressing layer 109 has conductivity with respect to both reflection layer 108 and the first metal layer 110, and that the second diffusion suppressing layer 204 has conductivity with respect to both ohmic contact metal layer 202 and the second metal layer 205. Here, conductivity that can cause a sufficient current for emission to flow in the light emitting device is sufficient.

In the present embodiment, an Ni—Ti layer containing an Ni—Ti alloy is used as diffusion suppressing layers 109 and 205. It is noted, however, that similar effects can be attained by using a layer having slow rate of diffusion to at least one of reflection layer 108 and the first metal layer 110, and to at least one of the ohmic contact metal layer 202 and the second metal layer 204. The diffusion suppressing layer is not specifically limited provided that it contains metal having such slow rate of diffusion. In view of higher effect of suppressing diffusion, it may preferably be a layer containing at least one metal selected from the group consisting of W, Mo, Nb, Ni and Ti.

Further, the layer may contain atoms other than those of such metals. By way of example, a layer containing W—Co or W—C may be used as the diffusion suppressing layer.

In the embodiment above, a III-group nitride semiconductor light emitting device has been described. As is well known, a III-V group compound semiconductor in which at least part of N in the III-group nitride semiconductor is replaced by As, P and/or Sb may be used.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A III-V group compound semiconductor light emitting device including a III-V group compound semiconductor, comprising:
    a first stacked body and a second stacked body,
    said first stacked body including a III-V group compound semiconductor stacked body of an n-type semiconductor layer, an active layer and a p-type semiconductor layer stacked in order, and a reflection layer, a first diffusion suppressing layer and a first metal layer formed on one main surface of said III-V group compound semiconductor stacked body, said first diffusion suppressing layer being a Ni—Ti alloy with a thickness between 0.01 to 1.0 μm,
    said second stacked body including a semiconductor substrate, an ohmic contact metal layer, a second diffusion suppressing layer, and a second metal layer,
    wherein said first and second stacked bodies are joined by said first metal layer and said second metal layer,
    said first diffusion suppressing layer is in contact with said first metal layer and suppresses diffusion of atoms between said reflection layer and said first metal layer,
    said first metal layer consists essentially of one or more metals selected from the group consisting of Au, Sn, Pd, In, Ge, Bi, Zn, and Pb, and
    said reflection layer contains an alloy having a metal of high reflectance along with at least one of a noble metal for suppressing oxidation or migration and a rare earth element, said metal of high reflectance selected from the group consisting of Ag, Al, Rh and Pd, and said noble metal for suppressing oxidation or migration selected from the group consisting of Au, Pt, Pd, Rh, Cu, and Bi.

2. The group compound semiconductor light emitting device according to claim 1, wherein
    said first diffusion suppressing layer is in contact with both said reflection layer and said first metal layer, whereby diffusion of atoms between said reflection layer and said first metal layer is suppressed.

3. The III-V group compound semiconductor light emitting device according to claim 1, wherein
    said first diffusion suppressing layer is conductive both to said reflection layer and said first metal layer.

4. The III-V group compound semiconductor light emitting device according to claim 1, wherein
    said second diffusion suppressing layer suppresses diffusion of atoms between said ohmic contact metal layer and said second metal layer.

5. The III-V group compound semiconductor light emitting device according to claim 4, wherein
    said second diffusion suppressing layer is conductive both to said ohmic contact metal layer and said second metal layer.

6. The III-V group compound semiconductor light emitting device according to claim 4, wherein:
    said second diffusion suppressing layer contains a metal.

7. The III-V group compound semiconductor light emitting device according to claim 6, wherein
    said metal is a metal selected from the group consisting of W, Mo, Nb, Ni and Ti and mixtures and alloys thereof.

8. The III-V group compound semiconductor light emitting device according to claim 6, wherein
    said metal is a Ni—Ti alloy.

9. The III-V group compound semiconductor light emitting device according to claim 1, wherein
    said first diffusion suppressing layer has a thickness of at least 50 nm.

10. The III-V group compound semiconductor light emitting device according to claim 1, wherein
    said reflection layer contains an alloy selected from the group consisting of Ag—Nd, Ag—Au, Ag—Pt, Ag—Rh, Ag—Cu, Ag—Pd, Ag—Cu—Nd, Ag—Bi—Nd, Ag—Pd, Ag—Cu—Pd, Al—Nd, Al—Au, Al—Pt, Al—Rh, Al—Cu, Al—Pd, Al—Cu—Nd, Al—Bi—Nd, Al—Pd and Al—Cu—Pd.

11. The III-V group compound semiconductor light emitting device according to claim 1, wherein
    said semiconductor substrate has resistivity of at least $1.0=10^{-6} \Omega \cdot cm$ to at most $10 \Omega \cdot cm$.

12. The III-V group compound semiconductor light emitting device according to claim 1, wherein
    said semiconductor substrate has thermal conductivity of at least $0.5\ Wcm^{-1}K^{-1}$.

13. The III-V group compound semiconductor light emitting device according to claim 1, wherein
    said semiconductor substrate is a substrate selected from the group consisting of an Si substrate, a GaAs substrate, a ZnO substrate, a Cu substrate, a W substrate, a CuW substrate, an Mo substrate, an InP substrate, a GaN substrate, an SiC substrate, and a GaP substrate.

14. The III-V group compound semiconductor light emitting device according to claim 1, wherein
    said noble metal for suppressing oxidation or migration is present in said alloy in an amount up to about 5 mass %.

15. A III-V group compound semiconductor light emitting device including a III-V group compound semiconductor, comprising:
    a first stacked body and a second stacked body;

said first stacked body including a III-V group compound semiconductor stacked body of an n-type semiconductor layer, an active layer and a p-type semiconductor layer stacked in order, and a reflection layer, a first diffusion suppressing layer and a first metal layer formed on one main surface of said III-V group compound semiconductor stacked body, said first diffusion suppressing layer being a Ni—Ti alloy with a thickness between 0.01 to 1.0 µm, said second stacked body including a semiconductor substrate, an ohmic contact metal layer, a second diffusion suppressing layer, and a second metal layer; wherein said first and second stacked bodies are joined by said first metal layer and said second metal layer, said active layer consisting of $Al_xGa_yIn_{1-x-y}N$, wherein each of the expressions $0 \leq x$, $0 \leq y$ and $(x+y) \leq 1$ are satisfied, said first diffusion suppressing layer suppressing diffusion of atoms between said reflection layer and said first metal layer, and said reflection layer contains at least a metal of high reflectance consisting of Ag and at least a metal for suppressing oxidation or migration selected from the group consisting of Au, Pt, Pd, Rh, Cu, Nd and Bi.

16. A III-V group compound nitride semiconductor light emitting device having an emission wavelength in a range of 360 to 600 nm and including a III-V group compound nitride semiconductor, comprising:

a first stacked body and a second stacked body, said first stacked body including a III-V group compound nitride semiconductor stacked body of an n-type semiconductor layer, an active layer and a p-type semiconductor layer stacked in order, and a reflection layer, a first diffusion suppressing layer and a first metal layer formed on one main surface of said III-V group compound nitride semiconductor stacked body, said first diffusion suppressing layer being a Ni—Ti alloy with a thickness between 0.01 to 1.0 µm, said second stacked body including a semiconductor substrate, an ohmic contact metal layer, a second diffusion suppressing layer, and a second metal layer, wherein said first and second stacked bodies are joined by said first metal layer and said second metal layer, said first diffusion suppressing layer is in contact with said first metal layer and suppresses diffusion of atoms between said reflection layer and said first metal layer, said first metal layer consists essentially of one or more metals selected from the group consisting of Au, Sn, Pd, In, Ge, Bi, Zn, and Pb, said reflection layer contains at least Ag, and said reflection layer has high reflectance of emission wavelength in the range of 360 to 600 nm.

17. The III-V group compound nitride semiconductor light emitting device according to claim 16, wherein said first diffusion suppressing layer is in contact with both said reflection layer and said first metal layer, whereby diffusion of atoms between said reflection layer and said first metal layer is suppressed.

18. The III-V group compound nitride semiconductor light emitting device according to claim 16, wherein said second diffusion suppressing layer contains a metal selected from the group consisting of W, Mo, Nb, Ni and Ti and mixtures and alloys thereof.

19. The III-V group compound nitride semiconductor light emitting device according to claim 16, wherein said first diffusion suppressing layer has a thickness of at least 50 nm.

20. The III-V group compound nitride semiconductor light emitting device according to claim 16, wherein said reflection layer contains at least a metal of high reflectance selected from the group consisting of Ag, Al, Rh, and Pd.

21. The III-V group compound nitride semiconductor light emitting device according to claim 16, wherein said reflection layer contains at least a metal of high reflectance selected from the group consisting of Ag, Al, Rh and Pd, and at least a metal selected from the group consisting of Au, Pt, Pd, Rh, Cu, Nd and Bi.

22. The III-V group compound nitride semiconductor light emitting device according to claim 16, wherein said semiconductor substrate is a substrate selected from the group consisting of an Si substrate, a GaAs substrate, a ZnO substrate, a Cu substrate, a W substrate, a CuW substrate, an Mo substrate, an InP substrate, a GaN substrate, an SiC substrate, and a GaP substrate.

23. The III-V group compound nitride semiconductor light emitting device according to claim 16, wherein said first stacked body further includes another ohmic contact metal layer between said p-type semiconductor layer and said reflection layer, and said another ohmic contact metal layer is a light transmitting layer.

24. The III-V group compound nitride semiconductor light emitting device according to claim 23, wherein said light transmitting layer contains one or more metals selected from the group consisting of Ni, In, Ag, Pt, and Pd.

* * * * *